United States Patent [19]

Bae

[11] Patent Number: 5,563,009
[45] Date of Patent: Oct. 8, 1996

[54] PHOTOMASK FOR FORMING A MICROPATTERN OF A SEMICONDUCTOR DEVICE

[75] Inventor: Sang M. Bae, Seoul, Rep. of Korea

[73] Assignee: Hyundai Electronics Industries CO., Ltd., Kyungki-Do, Rep. of Korea

[21] Appl. No.: 383,004

[22] Filed: Feb. 3, 1995

[30] Foreign Application Priority Data

Feb. 7, 1994 [KR] Rep. of Korea .................. 94-2246

[51] Int. Cl.⁶ .................................................. G03F 9/00
[52] U.S. Cl. .................... 430/005; 430/321; 430/326; 430/394
[58] Field of Search .................. 430/5, 321, 326, 430/394

[56] References Cited

U.S. PATENT DOCUMENTS 5,194,346  3/1983  Rolfson .
5,397,663  3/1995  Uesawa et al. ........................ 430/5
5,427,876  6/1995  Miyazaki et al. ................... 430/321

*Primary Examiner*—S. Rosasco
*Attorney, Agent, or Firm*—Fish & Richardson P.C.

[57] ABSTRACT

The photomask of the present invention uses chrome patterns formed on a quartz substrate in such a way that the ratio of the line width of chrome pattern to the width of the space between the chrome patterns is 3:5, a phase shift pattern formed at the center of the space between the chrome patterns to have smaller width than the line width of chrome pattern, and auxiliary patterns formed on both sides of the phase shift pattern to have same width together with the phase shift pattern as the line width of each of the chrome patterns.

4 Claims, 1 Drawing Sheet

5,563,009

PHOTOMASK FOR FORMING A MICROPATTERN OF A SEMICONDUCTOR DEVICE

FIELD OF THE INVENTION

The present invention relates to a photomask for forming a micropattern of a semiconductor device, and more particularly to a photomask used in a reiteration exposure method applied in forming a micropattern with greater resolution than that permitted by a stepper in a lithography process utilizing a stepper.

INFORMATION DISCLOSURE STATEMENT

FIG. 1 is a sectional view of a prior art photomask used in the reiteration exposure method. The photomask 1 is manufactured by forming two chrome patterns 3 and a phase shift pattern 4 on a quartz substrate 2. Defining a line width of the chrome pattern 3 as "x$\mu$m" (Here, x is a rational number having an absolute value not including x=0), a width of a space between the two chrome patterns 3 is formed to be "3x$\mu$m". That is, the ratio of the line width of chrome pattern to the width of the space between the chrome patterns is 1:3. The phase shift pattern 4 is formed to have same line width as the chrome pattern 3 at the center of the space. Since the ratio of the line width of chrome pattern to the width of the space between the chrome patterns is 1:3 and the phase shift pattern 4 is formed at the center of the space, it can be understood that the width between the chrome pattern 3 and the phase shift pattern 4 is "x$\mu$m". This width "x$\mu$m" is an important factor in deciding the size of the desired pattern in the manufacturing process of the semiconductor device.

A brief explanation of the reiteration exposure method utilizing the photomask 1 having the above described construction is described below. Art exposure process proceeds in two stages. First, the photomask 1 is fitted on the stepper(not shown) and then removed. Second, a photomask(not shown), which has the same construction as the photomask 1 except that the positions of the chrome patterns 3 and the phase shift pattern 4 are reversed, is fitted on the stepper. Since an ideal distribution curve of light intensity can be obtained between the chrome pattern and the phase shift pattern by performing the reiteration exposure as described above, a micropattern with greater resolution than that of the stepper can be formed.

However, since the photomask in which the ratio of the line width of chrome pattern to the width of the space between the chrome patterns is 1:3 has a narrow space area through which the light penetrates, it is difficult to freely adjust the light intensity distribution curve.

SUMMARY OF THE INVENTION

An object of the present invention is to make it possible to form a micropattern with greater resolution than that which is possible with the existing reiteration exposure method by utilizing a photomask in which the ratio of the line width of chrome pattern to the width of the space between the chrome patterns is 3:5 and a phase shift pattern and a auxiliary pattern are added to the portion of the space through which the light penetrates.

To achieve such object the photomask of the present invention comprises chrome patterns formed on a quartz substrate in such a way that the ratio of the line width of chrome pattern to the width of the space between the chrome patterns is 3:5, a phase shift pattern formed at the center of the space between the chrome patterns to have smaller width than the line width of chrome pattern, and auxiliary patterns formed on both sides of the phase shift pattern to have same width together with the phase shift pattern as the line width of each of the chrome patterns.

BRIEF DESCRIPTION OF THE DRAWINGS

For a fuller understanding of the nature and objects of the invention, reference should be had to the following detailed description taken in conjunction with the accompanying drawings in which.

Similar reference characters refer to similar parts through the several views of the drawings.

DETAILED DESCRIPTION OF THE INVENTION

Figure 1:
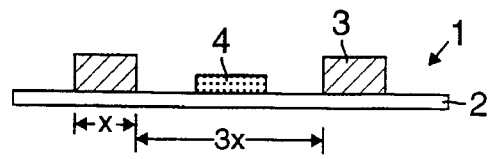
FIG. 1 is a sectional view of a prior art photomask.

A detailed explanation of a preferred embodiment of the present invention with reference to the accompanying drawings follows. FIG. 1 relates to the prior art and is discussed above.

Figure 2:
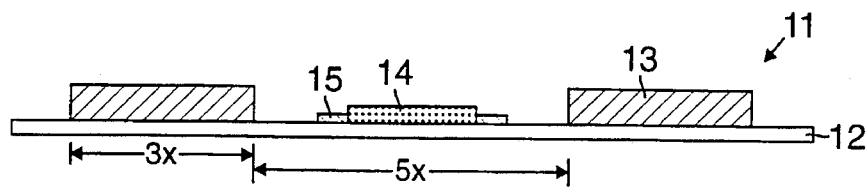
FIG. 2 is a sectional view of a photomask of the present invention.

Referring to FIG. 2, a photomask 11 of the present invention is manufactured by forming two chrome patterns 13, a phase shift pattern 14, and auxiliary patterns 15 formed on both sides of the phase shift pattern 14 on a quartz substrate 12. A line width of the chrome pattern 13 is formed to be "3x$\mu$m" in contrast to "x$\mu$m" defined above and a width of a space between two chrome patterns 13 is formed to be "5x$\mu$m". That is, the ratio of the line width of chrome pattern to the width of space between chrome patterns is 3:5.

Figure 4:
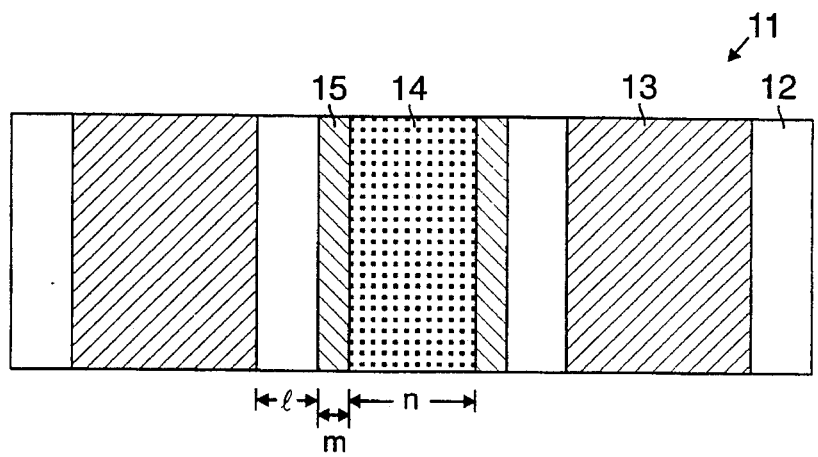
FIG. 4 is a top view of FIG. 2.

Referring to FIG. 4, the phase shift pattern 14 having the width of "n$\mu$m" is formed at the center of the space, and the auxiliary patterns 15 having the width of "m$\mu$m" are formed on both sides of the phase shift pattern 14 to have as low light intensity distribution as possible. Here, "n" and "m" are rational numbers having absolute values not including 0, and "n" is remarkably larger than "m". The sum of the width of the phase shift pattern 14 and the widths of the auxiliary patterns 15 formed on both sides of the phase shift pattern 14 is same as the line width of each with the chrome patterns 13. That is, "3x$\mu$m=n$\mu$m+2m$\mu$m". The phase shift pattern 14 is formed of Spin On Glass(SOG), and the auxiliary pattern 15 is formed with semitransparent material(for example, chrome having a light penetration rate of 10%) or a material which can completely shield the light.

The width between the chrome pattern 13 and the auxiliary pattern 15 is "1 $\mu$m", and the width "1 $\mu$m" becomes an important factor in deciding the size of the pattern desired in the manufacturing process of semiconductor device. L is a rational number having absolute number not including 0.

The reiteration exposure method utilizing the photomask 11 having the above described construction is briefly explained below. An exposure process proceeds in two stages. First, the photomask 11 is fitted on a stepper (not shown) and then removed. Second, a photomask (not shown), which has the same construction as the photomask 11 except that the positions of the chrome patterns 13 and the phase shift pattern 14 including the auxiliary pattern 15 are reversed, is fitted to the stepper. Since an ideal distribution curve of light intensity can be obtained between the chrome pattern and the phase shift pattern by performing the reiteration exposure as described above, a micropattern with greater resolution limit than that of the stepper can be formed.

Figure 3:
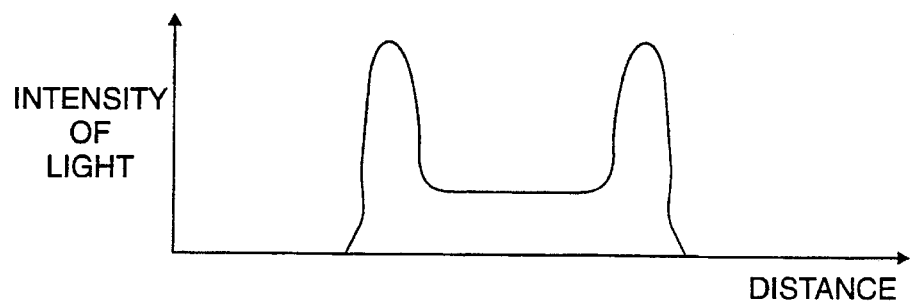
FIG. 3 is a graph showing a light intensity distribution curve of a light which penetrates the photomask of the present invention.

As shown in FIG. 3, which shows a light intensity distribution curve of the light which penetrates the photomask 11 of the present invention, a light intensity distribution curve is obtained in which the light intensity is the highest between the chrome pattern 13 and the auxiliary pattern 15, and the lowest at the phase shift pattern 14 and the auxiliary pattern 15. That is, the reiteration exposure method utilizing the photomask 11 of the present invention makes it possible to form a micropattern greater than the resolution limit of the stepper. Also, the disadvantage of existing photomask technology, that free adjustment of light intensity distribution curve is difficult because the space through which the light penetrates is narrow, can be overcome.

As described above, the photomask of the present invention, in which the ratio of the line width of chrome patterns is 3:5, can produce a preferred contrast. Therefore, the present invention can form a micropattern of the semiconductor device greater than the resolution limit of the stepper.

Although this invention has been described in its preferred form with a certain degree of particularity, those skilled in the art can readily appreciate that the present disclosure of the preferred form has been made only by way of example and that numerous changes in the details of the construction, combination and arrangement of parts may be resorted to without departing from the spirit and scope of the invention.

What is claimed is:

1. A photomask for reiteration exposure used for forming a micropattern greater than the resolution limit of a stepper, comprising:

chrome patterns formed on a quartz substrate, each said chrome pattern having a line width, and said chrome patterns seperated by a seperation space, a ratio of the line width of chrome pattern to the width of the seperation space between such chrome pattern is substantially 3:5;

a phase shift pattern formed at a center of the seperation space between said chrome patterns to have a smaller width than a line width of chrome pattern; and auxiliary patterns formed on both sides of said phase shift pattern, and wherein a width of said auxiliary patterns together with a width of said phase shift pattern being substantially the same as the line width of each of said chrome patterns and wherein said auxiliary patterns is formed with material which can shield light.

2. A photomask for reiteration exposure used for forming a micropattern greater than the resolution limit of a stepper, comprising:

chrome patterns formed on a quartz substrate, each said chrome pattern having a line width, and said chrome patterns seperated by a seperation space, a ratio of the line width of chrome pattern to the width of the seperation space between such chrome pattern is substantially 3:5;

a phase shift pattern formed at a center of the space between said chrome patterns, said phase shift pattern having a width which is smaller than the line width of said chrome pattern; and auxiliary patterns formed on both sides of said phase shift pattern, and wherein a width of said auxiliary patterns together with a width of said phase shift pattern being substantially the same as the line width of each of said chrome patterns and wherein said auxiliary patterns is formed with semitransparent material.

3. A photomask for reiteration exposure used for forming a micropattern greater than the resolution limit of a stepper, comprising:

chrome patterns formed on a quartz substrate, each said chrome pattern having a line width, and said chrome patterns seperated by a seperation space, a ratio of the line width of chrome pattern to the width of the seperation space between such chrome pattern is substantially 3:5;

a phase shift pattern formed at a center of the space between said chrome patterns to have smaller width than the line width of chrome pattern; and auxiliary patterns formed on both sides of said phase shift pattern to have same width together with said phase shift pattern as the line width of each of said chrome patterns, wherein said auxiliary patterns is formed with chrome having a light penetration rate of 10%.

4. A photomask for reiteration exposure used for forming a micropattern greater than the resolution limit of a stepper, comprising:

chrome patterns formed on a quartz substrate, each said chrome pattern having a line width, and said chrome patterns seperated by a seperation space, a line width of said chrome being wider than a seperation space between such chrome pattern is substantially 3:5;

a phase shift pattern formed at a center of the seperation space between said chrome patterns to have a smaller width that a line width of chrome pattern; and auxiliary patterns formed on both sides of said phase shift pattern, and wherein a width of said auxiliary patterns together with a width of said phase shift pattern being substantially the same as the line width of each of said chrome patterns, and wherein said auxiliary patterns is formed with material which can shield light.

* * * * *